(12) United States Patent
Suzuki

(10) Patent No.: US 8,796,607 B2
(45) Date of Patent: Aug. 5, 2014

(54) IMAGING APPARATUS AND IMAGING SYSTEM

(75) Inventor: Takanori Suzuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 302 days.

(21) Appl. No.: 13/371,284

(22) Filed: Feb. 10, 2012

(65) Prior Publication Data

US 2012/0211640 A1 Aug. 23, 2012

(30) Foreign Application Priority Data

Feb. 18, 2011 (JP) ................. 2011-033693

(51) Int. Cl.
*H01L 27/00* (2006.01)
(52) U.S. Cl.
USPC .................................................. 250/208.1
(58) Field of Classification Search
USPC ...................................................... 250/208.1
See application file for complete search history.

(56) References Cited

U.S. PATENT DOCUMENTS 5,856,699 A 1/1999 Hayashi et al.
6,483,567 B1 * 11/2002 Okada ........................... 349/158

FOREIGN PATENT DOCUMENTS

| CN | 100505279 C | 6/2009 |
| JP | 9-260626 A | 10/1997 |
| JP | 2005-311144 A | 11/2005 |
| JP | 2006-302990 A | 11/2006 |
| TW | 478136 B | 3/2002 |

* cited by examiner

*Primary Examiner* — Thanh Luu
(74) *Attorney, Agent, or Firm* — Canon USA Inc IP Division

(57) ABSTRACT

An intermediate member is disposed between a peripheral region and a third region, having been fixed to an imaging plate and a retaining plate. The intermediate member does not extend to between at least a part of a middle region and a forth region, such that a void is provided. The difference between the linear expansion coefficient of the imaging plate and the linear expansion coefficient of the intermediate member is smaller than the difference between the linear expansion coefficient of the retaining plate and the linear expansion coefficient of the intermediate member.

20 Claims, 11 Drawing Sheets

IMAGING APPARATUS AND IMAGING SYSTEM

BACKGROUND OF THE INVENTION

1. Field of the Invention

The present invention relates to an imaging apparatus using an imaging plate.

2. Description of the Related Art

There is being studied a super-high-sensitivity imaging apparatus using photo detectors having a large-area photoelectric conversion unit. Increasing the size of the imaging device (area of face of incidence) enables sufficient resolution to be achieved (i.e., a greater number of photo detectors to be achieved) while increasing the area of photo detectors. Such imaging devices can be realized in the form of thin plate-shaped imaging devices (imaging plates) by forming photo detectors in silicon plates or glass plates.

Now, a retaining plate is effectively used to ensure the mechanical strength of a large-size and thin imaging plate. Japanese Patent Laid-Open No. 2006-302990 discloses a substrate (retaining plate) retaining a large-size imaging plate, with the imaging plate and the substrate being adhered by an adhesive agent such as silver epoxy or the like.

SUMMARY OF THE INVENTION

An imaging apparatus according to one aspect of the present invention includes: an imaging plate, having a front face into which light is input, and a back face having a middle region including a center and a peripheral region surrounding the middle region; a retaining plate having a retaining face configured to retain the imaging plate from the back face side; and an intermediate member disposed between the peripheral region and the retaining face by being fixed to the imaging plate and the retaining plate; wherein the intermediate member does not extend to between at least a part of the middle region, and at least a part of a facing region on a plane extended from the retaining face, the facing region facing the middle region, and a void is formed therebetween; and wherein an arithmetic difference between a linear expansion coefficient of the imaging plate and a linear expansion coefficient of the intermediate member is less than an arithmetic difference between a linear expansion coefficient of the retaining plate and the linear expansion coefficient of the intermediate member. Due to one aspect of the disclosure, an imaging apparatus is provided where damage and deformation due to temperature change may be reduced.

Further features of the present invention will become apparent from the following description of exemplary embodiments with reference to the attached drawings.

DESCRIPTION OF THE EMBODIMENTS

Figure 11A:
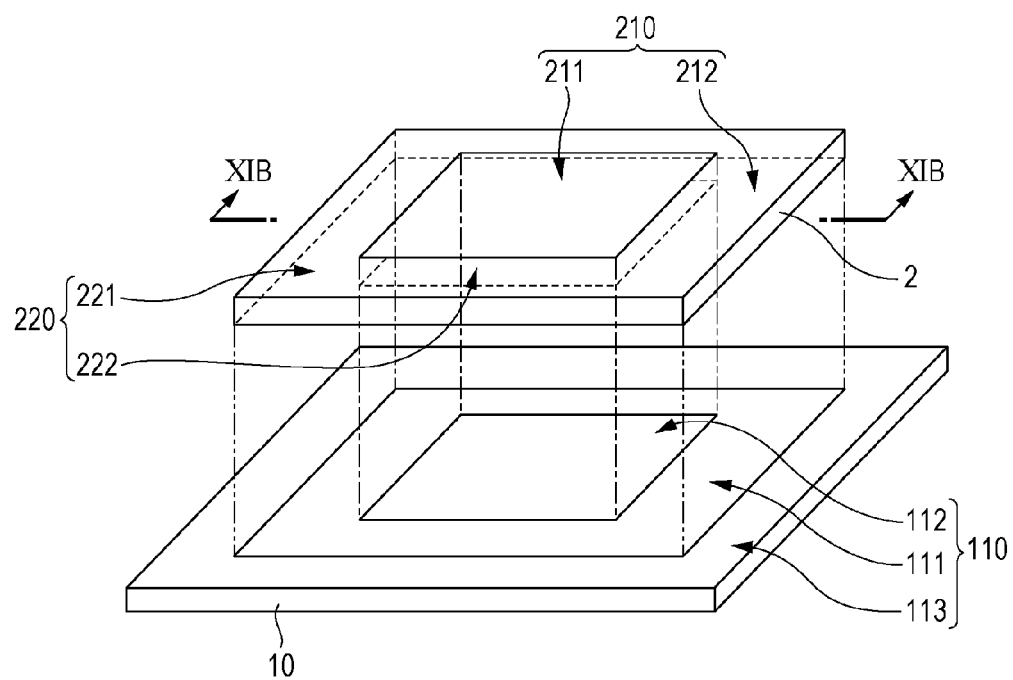
FIGS. 11A and 11B are schematic diagrams for describing an example of an imaging apparatus.
Figure 11B:
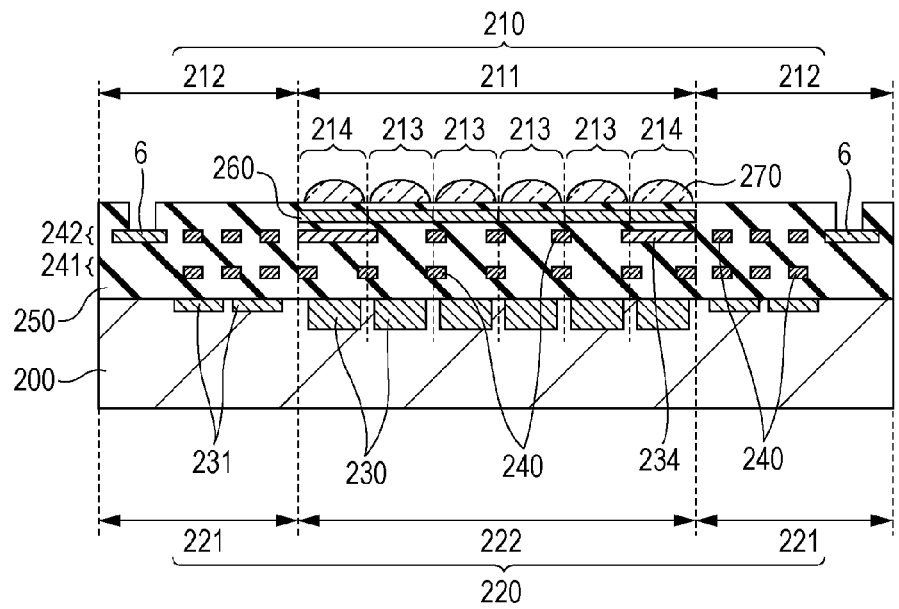

An overview of an imaging apparatus 1 according to the embodiment of the present invention will first be described with reference to FIGS. 11A and 11B. The imaging apparatus 1 has an imaging plate 2 and retaining plate 10, with FIG. 11A illustrating the positional relation between the imaging plate 2 and retaining plate 10. FIG. 11B is a cross-sectional diagram along XIB-XIB of the imaging plate 2 in FIG. 11A.

The imaging plate 2 is a solid-state imaging device (image sensor), having two main faces of a front face 210 and back face 220 which is a face on the opposite side from the front face 210. Light to be imaged enters the front face 210, and accordingly the front face 210 can also be called the face of incidence. Typically, both main faces, i.e., the front face 210 and back face 220, have the same shape and the same area, with the shape thereof being square. The greater that area of the front face (and accordingly back face 220) is, the more marked the advantages of the embodiment of the present invention become, but the present invention may be applicable unrestricted by the area of the front face 210. In practical use, examples of the area of the front face 210 may be 300 $mm^2$, 1,000 $mm^2$ or around. Further, the embodiment of the present invention may yield sufficient advantages even with an imaging apparatus 1 having an area of 10,000 $mm^2$ or around for the front face 210, a size where the effects of thermal expansion may be great.

The front face 210 has a first region 211 and a second region 212 surrounding the first region 211. The back face 220 has a peripheral region 221 and a middle region 222 surrounded by the peripheral region 221. Thus, the second region 212 is a region situated on the outer side of the first region 211 on the front face 210 (between the perimeter of the front face 210 and the perimeter of the first region 211). The peripheral region 221 is a region situated on the outer side of the middle region 222 on the back face 220 (between the perimeter of the back face 220 and the perimeter of the middle region 222). The middle region 222 includes the center of the back face 220. In the event that the center cannot be clearly determined, the geometric center of gravity of the back face 220 is taken as the center of the back face 220. The middle region 222 may occupy ¼ or more of the area of the back face 220, or may occupy ½ or more of the area of the back face 220.

The second region 212 is an area corresponding to the peripheral region 221, that is to say a region of orthogonal projection of the peripheral region 221 onto the front face 210 from the back face 220, having substantially the same shape as the peripheral region 221. The first region 211 is a region corresponding to the middle region 222, that is to say a region of orthogonal projection of the middle region 222 onto the front face 210 from the back face 220, having substantially the same shape as the middle region 222.

Multiple photo detectors 213 are arrayed on the front face 210. Multiple photo detectors 213 may be arrayed one-dimensionally to be used as a line sensor, or four or more photo detectors 213 may be arrayed two-dimensionally to be used as an area sensor. Generally, an area sensor requires the area of the front face 210 to be greater that of a line sensor, so the present invention lends itself particularly well to application to an area sensor.

Each photo detector 213 functions as a pixel, so the region where the multiple photo detectors 213 are arrayed can also be referred to as a pixel region. The multiple photo detectors 213 are arrayed in at least the first region 211. The multiple photo detectors 213 may be arrayed only in the first region 211, or a part thereof may be arrayed in the second region 212. That is to say, the entire pixel region may be included in the first region 211, or a part of the pixel region may be included in the second region 212.

Each photo detector 213 has a photoelectric conversion unit 230, which converts incident light to the front face 210 into signal charges. An image can be obtained by reading out the signal charges using a read circuit not shown in the drawings. Examples of incident light include infrared rays, visible light, ultraviolet rays, X-rays, and γ rays. Incident light is light which has reflected off of a subject, radiant light from the subject, light which is passed through the subject, and so forth. In the case of radiation such as X-rays and γ rays, the wavelength can be converted using a scintillator and the converted wavelength light (fluorescence) converted into signal charges at the photoelectric conversion units. The imaging apparatus 1 can be applied to, in addition to scenic and biological photography, medical use and astronomic observation.

While the multiple photo detectors 213 function as effective pixels for obtaining an image, shielded pixels 214 functioning as ineffective pixels which do not directly contribute to obtaining of an image may also be provided. The shielded pixels 214 have the photoelectric conversion unit 230, in the same way as with the photo detectors 213, but are arranged with a light shielding member 234 such that the incident light does not reach the photoelectric conversion unit 230. The shielded pixels 214 may be used as pixels for measuring dark current, for example.

Thus, in the case of providing the shielded pixels 214 functioning as ineffective pixels (also called optically black pixels, hereinafter may be referred to as "OB pixels"), a region corresponding to the shielded pixels 214 (invalid pixel region) is also deemed to be a pixel region in addition to the region corresponding to the photo detector 213 (valid pixel region).

While the primary material of the imaging plate 2 is not restricted in particular, normally silicon which is a semiconductor, monocrystalline silicon in particular, is normally used for the CMOS imaging plate 2 (CMOS image sensor) shown in FIG. 11B or CCD imaging plate 2 (CCD image sensor) not shown in the drawings. The linear expansion coefficient of silicon is $2\times10^{-6}$ to $4\times10^{-6}$/K. Also, glass may be used for the material for the imaging plate 2. In the case of glass, the imaging plate 2 can be obtained by forming thin-film photo detectors having MIS structures or PIN structures or the like, or thin-film transistors (TFT), upon a glass substrate. The linear expansion coefficient of glass depends on the type, but generally is $10\times10^{-6}$/K or lower, being $9\times10^{-6}$/K for commonly-used soda lime glass, and $0.5\times10^{-6}$/K for quartz glass.

The example of the imaging plate 2 shown in FIG. 11B will be described in further detail. For the configuration of the imaging plate of which silicon is the primary material, a pixel amplifying type imaging plate or charge transfer type imaging plate can be used. Photodiodes serving as the photoelectric conversion units 230 are formed on the region of front face of a silicone substrate 200 corresponding to the first region 211. Alternatively, photogates may be used instead of photodiodes. Unshown amplifying transistors are also disposed besides the photodiodes. Further, transfer transistors, reset transistors, and selecting transistors may be provided as necessary. These amplifying transistors and the like may be provided one to each photoelectric conversion unit 230, or may be provided in a pixel sharing manner where one amplifying transistor is provided for several photoelectric conversion units 230. Adjacent photoelectric conversion units 230 are separated one from another by separating structures such as LOCOS or STI or the like. On the other hand, transistors 231 and diodes and the like making up peripheral circuits such as vertical scanning circuits and horizontal scanning circuits, amplifiers, A/D converting circuits, and so forth, may be disposed in the region corresponding to the second region 212.

The above-described transistors and diodes are electrically connected with each other by wiring 240 configured of a first metal layer 241 and second metal layer 242 patterned in a predetermined form. The first metal layer 241 is provided closer to the silicon substrate 200 than the second metal layer 242. While the number of metal layers is described as being two layers here, this may be just one layer, or one or more metal layers may be further formed between the first metal layer 241 and second metal layer 242 so as to have three or more metal layers. The metal layers are formed of aluminum or copper, and are layered with multiple inter-layer insulating layers configuring an insulating member 250 introduced therebetween. The wiring 240 of each metal layer is electrically connected one with another by way of unshown via holes provided in the inter-layer insulating layers.

A part of the second metal layer 242 is formed above the photoelectric conversion units 230 of the shielded pixels 214, and can be used as the light shielding member 234 to prevent light from entering the photoelectric conversion unit 230. Also, another part of the second metal layer 242 can be used as an electrode 6. A part of the wiring 240 and the light shielding member 234 and electrode 6 can be formed at the same time with the patterned second metal layer 242 using lithography. A color filter 260 is disposed above the insulating member 250, and a micro lens 270 is provided above the color filter 260 for each pixel. The first metal layer 241 and second metal layer 242 are disposed so as not to cover the photoelectric conversion units 230 of the photo detectors 213, such that the light which has passed through the micro lenses 270 and color filters 260 enters the photoelectric conversion units 230. A transparent material having a refractive index different from that of the inter-layer insulating layer (generally a refractive index greater than that of the inter-layer insulating layer) may be used to provide an optical waveguide structure directly above the photoelectric conversion unit 230. Also, the wiring layer may be situated on the opposite side of the silicon substrate 200 from the front face 210, i.e., on the back face 220 side. Imaging plates with such a structure are often called "back-illuminated" types, but it goes without saying that the light enters the front face 210 and not the back face 220 with the present embodiment, even in the event that such a "back-illuminated" structure is employed.

The imaging plate 2 includes various members handling electric and/or optical and/or chemical and/or mechanical functions, besides the silicon substrate 200. Accordingly, the linear expansion coefficient of the imaging plate 2 should be conceived as being not just the linear expansion coefficient of the silicon substrate 200 but the linear expansion coefficient of complex members including the silicon substrate 200 which has been substantially integrated. However, approximating the linear expansion coefficient of the material of the substrate (silicon or glass) which is typically the primary material of the imaging plate 2 (the material making up the greatest part of the volume of the imaging plate 2) with the linear expansion coefficient of the imaging plate 2 is valid. This holds true for the retaining plate 10 as well. In the event of measuring the linear expansion coefficient of the imaging plate 2 or retaining plate 10 in a precise manner, results of measurement performed with optical scanning stipulated in JISZ2285 may be used.

The retaining plate 10 is a plate-shaped member having sufficient rigidity for retaining the imaging plate 2. The back face 220 of the imaging plate 2 and a retaining face 110 of the retaining plate 10 face one another. The retaining plate 10 retains the imaging plate 2 from the back face 220 side. The retaining face 110 may have a third region 111 facing the peripheral region 221, a fourth region 112 facing the middle region 222, and a fifth region 113 not facing the imaging plate 2. The third region 111 is a region of orthogonal projection of the peripheral region 221 onto the retaining face 110 from the back face 220, but the fourth region 112 does not have to be the same shape as the peripheral region 221. The fourth region 112 is a region of orthogonal projection of the middle region 222 onto the retaining face 110 from the back face 220, but the third region 111 does not have to be the same shape as the middle region 222.

However, the retaining plate 10 (retaining face 110) may omit at least one of the fourth region 112 and fifth region 113. A case where the fourth region 112 is omitted is a case where, for example, the third region 111 of the retaining face 110 exhibits a closed loop shape, and a region corresponding to the fourth region 112 surrounded by the third region 111 serves as an opening. A case where the fifth region 113 is omitted is a case where the retaining plate 10 is completely hidden by the imaging plate 2 when the imaging apparatus 1 is viewed from the front face 210 side.

However, the fourth region 112 and fifth region 113 can be stipulated on the imaging apparatus 1 even if the retaining plate 10 does not have the fourth region 112 or fifth region 113. That is to say, a plane including the third region 111 (retaining face 110) is set. This plane includes the retaining face 110 obtained by imaginarily extending the third region 111 in a straight manner, and is an imaginary geometric plane parallel to and including the retaining face 110. The third region 111 and fourth region 112 can be stipulated from the positional relation between the peripheral region 221 and middle region 222 on this imaginary plane.

The primary material of the retaining plate 10 is not restricted in particular as long as it has sufficient rigidity for the retaining plate 10 to retain the imaging plate 2, with examples including metal (simple or alloy), ceramics, and plastic. Using metal is advantageous in that electrical noise prevention due to electroconductivity (electromagnetic shielding) can be achieved. Also, metal is advantageous over ceramics regarding ability for larger sizes, ease of working, and costs. Suitable metals include aluminum, aluminum alloys, copper, and stainless steel, and a suitable thickness for the retaining plate 10 is 0.5 to 5 mm. The linear expansion coefficient of metal generally is $10 \times 10^{-6}$ to $40 \times 10^{-6}$/K. As for specific examples, the linear expansion coefficient of aluminum is $24 \times 10^{-6}$/K, the linear expansion coefficient of copper is $17 \times 10^{-6}$/K, and the linear expansion coefficient of SUS304 (stainless steel) is $17 \times 10^{-6}$/K.

The present embodiment may be advantageous when applied to a case where the linear expansion coefficient of the imaging plate 2 and the linear expansion coefficient of the retaining plate 10 differ, such as described above, and enables a wider range of materials for the retaining plate 10 to be selected from as compared to a case of matching the linear expansion coefficient of the imaging plate 2 and the linear expansion coefficient of the retaining plate 10. Using a material with low linear expansion coefficient such as Invar or 42 alloy even allows the linear expansion coefficient of the imaging plate 2 to be greater than the linear expansion coefficient of the retaining plate 10. From the perspective of reducing noise of the imaging plate 2, a nonmagnetic material may be used rather than using a ferromagnetic material such as 42 alloy or the like. With configurations using typical nonmagnetic materials such as aluminum, aluminum alloy, copper, stainless steel or the like, the linear expansion coefficient of the retaining plate 10 is greater than the linear expansion coefficient of the imaging plate 2.

Note that with the present embodiment, the term "plate-shaped" stipulating the shape of the imaging plate 2 and retaining plate 10 means a shape having a thickness around a level at which the area of a cross-section perpendicular to the front face 210 or retaining face 210 does not exceed the area of the front face 210 or retaining face 110. The thickness of the imaging plate 2 is the distance between the front face 210 and the back face 220, and the thickness of the retaining plate 10 is the distance between the retaining face 110 and the rear face thereof. For example, let us say that the imaging device is a cuboid where, regarding the perimeter of the front face 210, the length of the long side is L, the length of the short side is W, and the thickness is T. The area of the front face 210 is L×W, and the area of a cross-sectional face perpendicular to the front face 210 is L×T, but with a plate-shaped imaging device (imaging plate), W>T should be satisfied. The same holds for the retaining plate 10. When temperature change occurs with an imaging apparatus 1 using such an imaging plate 2 and retaining plate 10, the effects of thermal expansion of the imaging plate 2 and retaining plate 10 are dominant in the direction along the front face 210 as compared to the direction perpendicular to the front face 210. With the imaging plate 2 of which silicon is the primary material, the thickness T of the silicon substrate 200 is typically between 0.1 mm and 2.0 mm, and more typically between 0.5 mm and 1.0 mm.

While Japanese Patent Laid-Open No. 2006-302990 discloses an example of using an imaging plate with silicon as the primary material, with the linear expansion coefficient of the retaining plate being 8 to $10 \times 10^{-6}$/K, the linear expansion coefficient of silicon is known to be $3 \times 10^{-6}$/K. In the event that the linear expansion coefficient of the imaging plate and retaining plate differ in this way, there is difference in the amount of thermal expansion in the two in the event that there is temperature change in one or both of the imaging plate and retaining plate. With a large-scale imaging plate, the amount of thermal expansion is great, so the thermal stress due to difference in amount of thermal expansion may damage the imaging plate, or may deform the image plate by bowing or the like. Bowing due to thermal expansion may be suppressed since this can lead to change in aberration due to change in temperature and separation from the retaining plate.

The present embodiment provides an imaging apparatus with reduced damage and deformation due to change in temperature. The present embodiment enables reduction in the effects on the imaging apparatus 1 due to difference in the amount of thermal expansion between the imaging plate 2 and retaining plate 10 having different linear expansion coefficients, and particularly reduces the effects of thermal expansion at the imaging plate 2 and retaining plate 10 in the direction following the front face 210. Specific configurations will be described below by way of embodiments.

First Embodiment

Figure 1A:
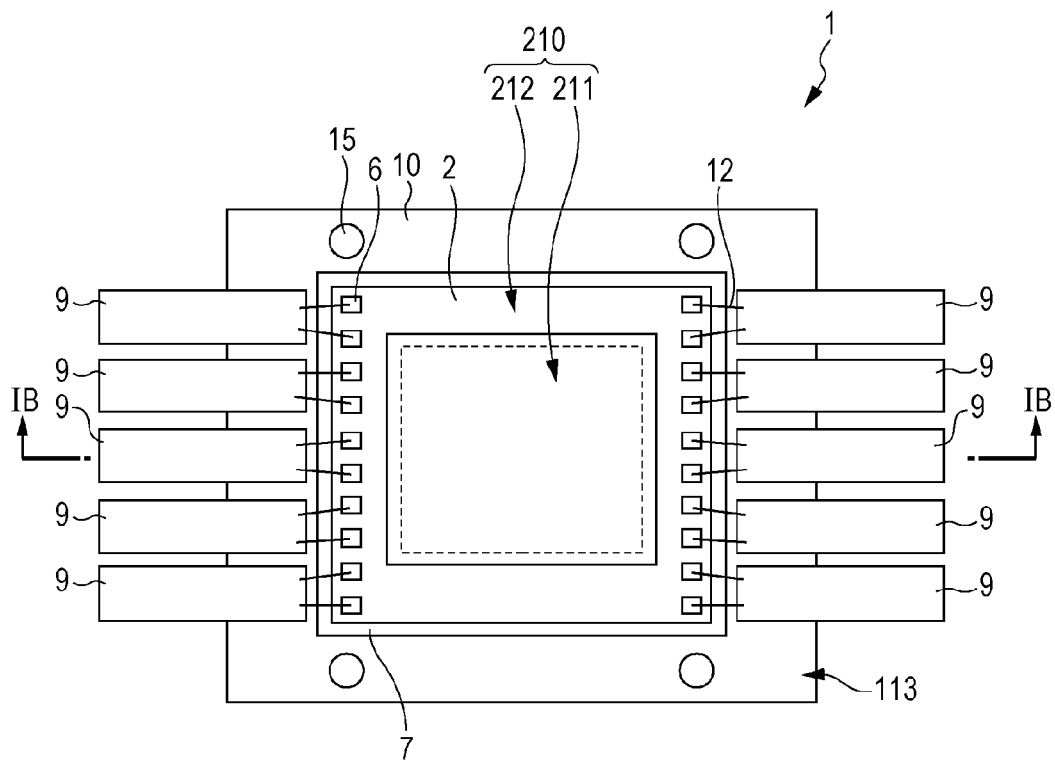
FIGS. 1A and 1B are schematic diagrams for describing a first embodiment.
Figure 1B:
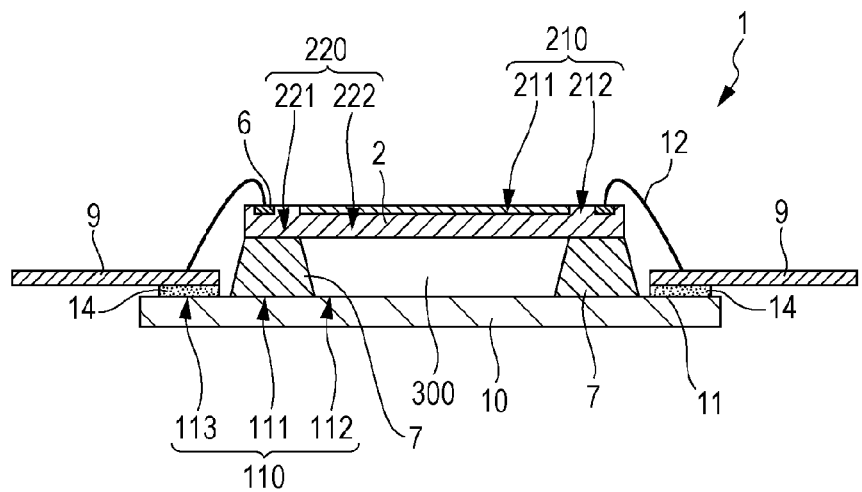

A first embodiment of the imaging apparatus 1 according to the present embodiment will be described with reference to FIGS. 1A and 1B. FIG. 1A is a plan view of the imaging apparatus 1 as viewed from the front face 210 side, and FIG. 1B is a cross-sectional view along IB-IB in FIG. 1A.

An intermediate member 7 is provided between the retaining face 110 and the back face 220. The intermediate member 7 adheres the back face 220 and retaining face 110 together, and as a result, the imaging plate 2 and retaining plate 10 are fixed together by the intermediate member 7.

Specifically, the intermediate member 7 is situated between at least the peripheral region 221 of the back face 220 and the third region 111 of the retaining face 110. On the other hand, the intermediate member 7 does not extend to between at least a part of the middle region 222 of the back face 220 and at least a part of the fourth region 112 of the retaining face 110, from between the peripheral region 221 and the third region 111 of the retaining face 110. As a result, a void 300 is provided to at least a part of between the middle region 222 and fourth region 112. The void 300 is a space where a gas exists, and may or may not by atmospheric pressure. The middle region 222 and fourth region 112 may be partially fixed by the intermediate member 7, but should be arranged such that the entirety of the middle region 222 and fourth region 112 are not fixed by the intermediate member 7. The intermediate member 7 may not extend from between the peripheral region 221 and the third region 111 of the retaining face 110 to between the center of the middle region 222 and the center of the fourth region 112. Also, the intermediate member 7 may not extend from between the peripheral region 221 and the third region 111 of the retaining face 110 to between ¼ or more of the area of the middle region 222 and ¼ or more of the area of the fourth region 112. Further, the intermediate member 7 may not extend from between the peripheral region 221 and the third region 111 of the retaining face 110 to between ½ or more of the area of the middle region 222 and ½ or more of the area of the fourth region 112. Note that the intermediate member 7 does not have to be situated over the entirety of between the middle region 222 and fourth region 112.

Description will be made regarding the relation between the imaging plate 2, intermediate member 7, and retaining plate 10. In the following, Y will represent the linear expansion coefficient of the intermediate member 7, X the linear expansion coefficient of the imaging plate 2, and Z the linear expansion coefficient of the retaining plate 10 (where $X \neq Z$). The present embodiment satisfies a condition (i) that $|X-Y|<|Z-Y|$. This condition (i) is a condition that the difference between the linear expansion coefficient X of the imaging plate 2 and the linear expansion coefficient Y of the intermediate member 7 ($|X-Y|$ intermediate member) is smaller than the difference between the linear expansion coefficient Z of the retaining plate 10 and the linear expansion coefficient Y of the intermediate member 7 ($|Z-Y|$ intermediate member).

This condition (i) is satisfied in common with the later-described second through eighth embodiments, as well. In the event that $X<Z$, $0<Y<(X+Z)/2$ holds, and in the event that $Z<X$, $Y>(X+Z)/2$ holds. $Z>X$ may be more preferable than $Z<X$. Further, a condition (ii) that $|X-Y|<|Z-X|$ may be preferably satisfied. This condition (ii) is a condition that the difference between the linear expansion coefficient X of the imaging plate 2 and the linear expansion coefficient Y of the intermediate member 7 ($|X-Y|$) is smaller than the difference between the linear expansion coefficient X of the imaging plate 2 and the linear expansion coefficient Z of the retaining plate 10 ($|Z-X|$). More preferably, a condition (iii) that $|Z-Y|<|Z-X|$ may be satisfied. This condition (iii) is a condition that the difference between the linear expansion coefficient Z of the retaining plate 10 and the linear expansion coefficient Y of the intermediate member 7 ($|X-Y|$) is smaller than the difference between the linear expansion coefficient X of the imaging plate 2 and the linear expansion coefficient Z of the retaining plate 10 ($|Z-X|$). Conditions (i) through (iii) are all satisfied by $X \leq Y<(X+Z)/2$ in the case of $X<Z$, and by $(X+Z)/2<Y \leq X$ in the case of $X>Z$. $X=Y$ may be most preferable.

When members with different linear expansion coefficients are fixed one to another, difference in the amount of thermal expansion will occur among the members due to change in temperature, generating stress among the members. According to the above conditions, the difference in thermal expansion which is generated between the imaging plate 2 and the intermediate member 7 can be made to be smaller than the difference in thermal expansion generated between the retaining plate 10 and intermediate member 7. Additionally, the stress generated between the imaging plate 2 and intermediate member 7 can be conceivably reduced by the intermediate member 7 not existing between at least a part of the middle region 222 of the back face 220 and the fourth region 112, due to the thermal expansion of the intermediate member 7 being dispersed in a direction toward the inner side of the imaging apparatus 1 (fourth region 112 and middle region 222) and a direction toward the outer side of the imaging apparatus 1 (fifth region 113). Thus, effects of stress on the imaging plate 2 can conceivably be reduced.

The width of the intermediate member 7 (the length of the intermediate member 7 in the direction from the center of the back face 220 toward the perimeter of the back face 220) is preferably as short as possible. In the event that the width of the intermediate member 7 is extremely great, the thermal expansion of the intermediate member 7 increases, and the stress generated between the imaging plate 2 and intermediate member 7 and/or between the intermediate member 7 and retaining plate 10 may no longer be negligible. Accordingly, the width of the intermediate member 7 is preferably equal to or smaller than the distance from the center of the back face 220 in the aforementioned direction to the perimeter of the back face 220 (typically, W/2 or L/2), including a later-described extending portion 71. Further, the width of the intermediate member 7 is preferably ⅔ or less of the distance from the center of the back face 220 in the aforementioned direction to the perimeter of the back face 220, and more preferably ¼ or less. The area of the intermediate member 7 at the imaging plate 2 side is preferably ½ or less of the area of the front face 210 of the imaging plate 2, and more preferably ¼ or less.

The material of the intermediate member 7 is not restricted in particular as long as it is capable of fixing the imaging plate 2 and the retaining plate 10, and satisfies the above conditions. Adhesion between the intermediate member 7 and the imaging plate 2 and retaining plate 10 may be achieved by adhesion using the adhesive or cohesive nature of the intermediate member 7, or by fusing or welding. However, fusing and welding involve high temperature processes with great influence of temperature change, and accordingly adhesion is preferable. Due to the same reason, adhesion is preferably performed using an adhesive agent which cures at room temperature. For example, adhesive agents which cure at room temperature due to evaporation of solvent, chemical reaction, light curing, or the like, may be used.

With the example shown in FIG. 1A, the intermediate member 7 indicated by hatching surrounds the void 300 in an uninterrupted manner, but may be formed with interruptions in the form thereof. Forming interruptions in the intermediate member 7 gives leeway to thermal expansion at the interruptions, and accordingly stress can be alleviated as compared to a case where the intermediate member 7 is disposed surrounding the void 300 in an uninterrupted manner.

Other configurations will be described with regard to FIGS. 1A and 1B. Circuit members 9 are fixed to the retaining plate 10 by an adhesive agent 14. A known adhesive agent such as epoxy resin or sheet adhesive or the like may be used for the adhesive agent 14. Electrodes 6 are disposed in the second region 212 of the imaging plate 2, and the electrodes 6 and circuit members 9 are connected by bonding wire. Note that "bonding wire" as used with the present embodiment means thin wires of metal (either simple or alloy) electrically connecting conductors (the electrodes 6 and circuit members 9) by wire bonding. The circuit members 9 may be flexible printed circuits (abbreviated as "FPC"), rigid printed boards, leads, or land grid arrays (abbreviated as "LGA"). The circuit members 9 may be formed as a single member, but since thermal expansion increases as the area of the circuit member 9 increases, dividing into multiple circuit members 9 is preferable. An alternative configuration may be made wherein flexible printed circuits are adhered to the second region 212 of the imaging plate 2 rather than the retaining plate 10, with the electrodes 6 and the flexible printed circuits being connected by binding wire on the front face 210. Furthermore, the electrodes 6 and flexible printed circuits may be connected using anisotropic conductive film (abbreviated as "ACF") to obtain electrical and mechanical connection.

Second Embodiment

Figure 2A:
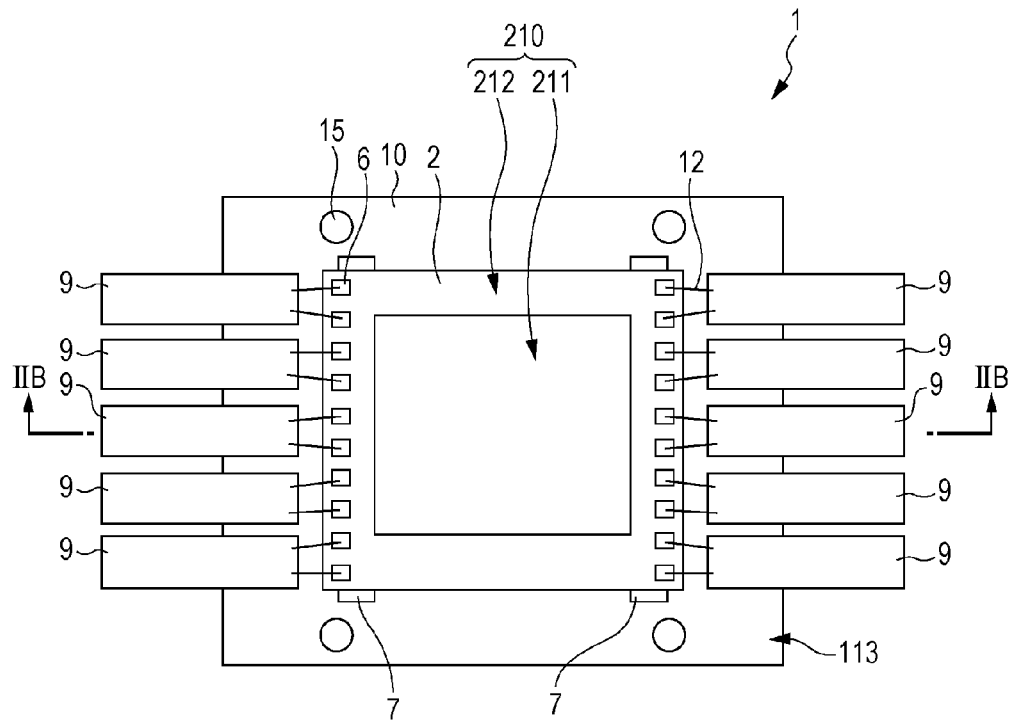
FIGS. 2A and 2B are schematic diagrams for describing a second embodiment.
Figure 2B:
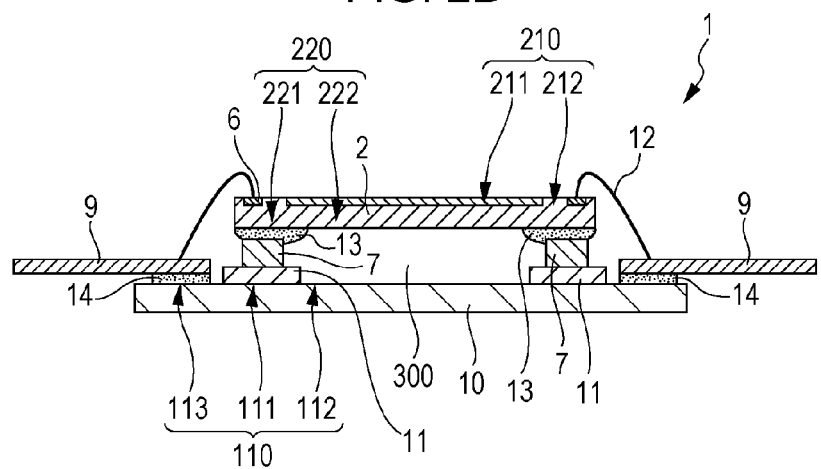

A second embodiment will be described with reference to FIGS. 2A and 2B. FIG. 2A is a plan view of the imaging apparatus 1 as viewed from the front face 210 side, and FIG. 2B is a cross-sectional view along IIB-IIB in FIG. 2A. Portions having functions equivalent to those in FIGS. 1A and 1B are denoted with the same reference numerals, and detailed description thereof will be omitted. With the second embodiment, the intermediate member 7 is fixed to the peripheral region 221 using an adhesive agent 13. The adhesive agent 13 may be a common die-bond paste. Fixing of the intermediate member 7 and third region 111 may be achieved using the same adhesive agent as the adhesive agent 13, but the form shown in FIGS. 2A and 2B uses a buffer member 11. Fixing of the intermediate member 7, imaging plate 2, and retaining plate 10 is not restricted to adhesive agent, and fusing or welding or the like may be used, but adhesive agent is preferable from the reason described with the first embodiment.

With the present embodiment, an intermediate member 7 not having adhesive nature of itself can be used. Generally, material of the imaging plate 2 such as silicon or glass or the like has no adhesive nature of its own, but the same material as the primary material of the imaging plate 2 can be used for the intermediate member 7 by using the adhesive agent 13. That is to say, if the primary material of the imaging plate 2 is silicon, silicon can be used as the primary material of the intermediate member 7, and if the primary material of the imaging plate 2 is glass, glass can be used as the primary material of the intermediate member 7. As a result, the difference in linear expansion coefficient of the intermediate member 7 and linear expansion coefficient of the imaging plate 2 (|X−Y|) can be made to be zero or nearly zero. The present embodiment is particularly suitable applicable to cases where the primary material of the imaging plate 2 is silicon, since thermal expansion is thought to be a factor in causing dark current due to warpage generated in the crystalline structure of the silicon substrate. In the event that the dimension of the front face 210 (diagonal length in the case of a square, diameter in the case of a circle) is 100 mm or greater, the same material as that of the imaging plate 2 is preferably used for the intermediate member 7 so as to sufficiently minimize the difference in the linear expansion coefficient of the intermediate member 7 and the linear expansion coefficient of the imaging plate 2.

While the linear expansion coefficients of the adhesive agent and buffer member are not restricted in particular, the effects of thermal expansion of the adhesive agent and buffer member can be reduced by forming thinly. On the other hand, the thicker the intermediate member 7 is, the greater the advantages of the present embodiment are. In practical use, the thickness of the intermediate member 7 is 0.1 mm or thicker. The thickness of the intermediate member 7 is preferably half the distance between the peripheral region 221 and retaining face 110 (third region 111) or greater, and more preferably 0.5 mm or greater. On the other hand, if the thickness of the intermediate member 7 is extremely great, displacement of the front face 210 in a direction perpendicular to the front face 210 may become marked. Accordingly, the thickness of the intermediate member 7 is preferably 2.0 mm or less, and more preferably 1.0 mm or less. In the event that the principal material of the imaging plate 2 and the intermediate member 7 is silicon, the thickness of the intermediate member 7 is preferably 0.5 mm or greater and 2.0 mm or less.

While the intermediate member 7 is shown as being one continuous member in the example in FIG. 1A, the intermediate member 7 is multiple divided members (two here) in the example in FIG. 2A. Placing the intermediate member 7 in a divided manner can reduce the effects of thermal expansion of the intermediate member 7. The area of the multiple intermediate members 7 at the imaging plate 2 side is preferably ¼ the area of the front face 210 of the imaging plate 2 or less.

The thickness of the buffer member 11 is preferably 0.1 mm or greater, with a Young's modulus of 100 Mpa or less. If the thickness of the buffer member 11 is extremely great, the imaging plate 2 readily becomes unstable as to the retaining plate 10, so the thickness of the buffer member 11 is preferably 1.0 mm or less, and more preferably 0.5 mm or less. Specific examples of material of the buffer member 11 include gel sheets, adhesive rubber sheets, liquid adhesive agent, low-elasticity resin, and double-faced tape. Using such a buffer member 11 allows stress between the retaining plate 10 and intermediate member 7, which readily becomes greater than the stress between the imaging plate 2 and intermediate member 7, to be alleviated, thereby reducing the possibility of the intermediate member 7 separating from the retaining plate 10, and improving reliability of the fixing of the retaining plate 10 and intermediate member 7.

Third Embodiment

Figure 3A:
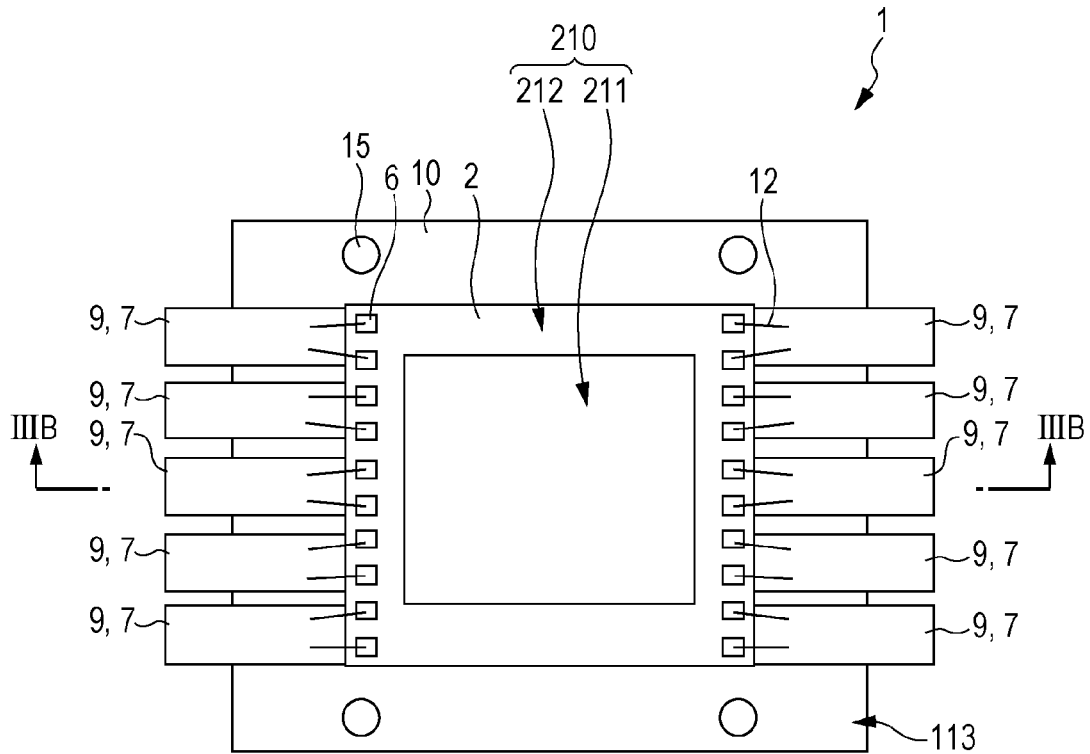
FIGS. 3A and 3B are schematic diagrams for describing a third embodiment.
Figure 3B:
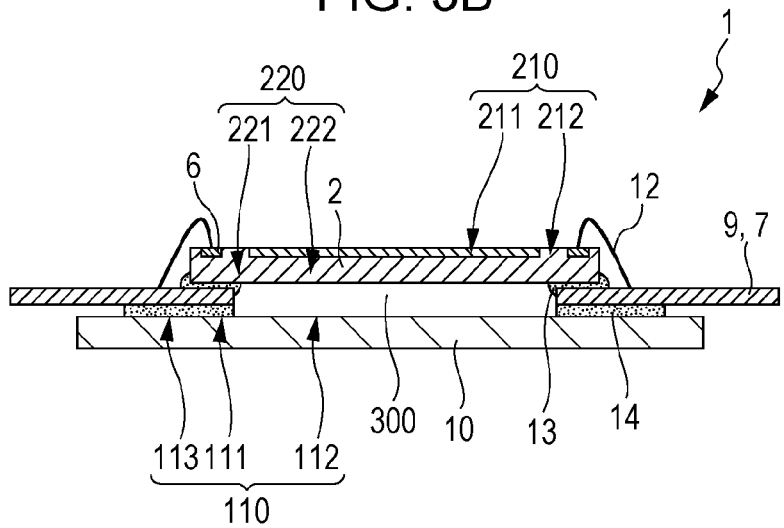

A third embodiment will be described with reference to FIGS. 3A and 3B. FIG. 3A is a plan view of the imaging apparatus 1 as viewed from the front face 210 side, and FIG. 3B is a cross-sectional view along IIIB-IIIB in FIG. 3A. Portions having functions equivalent to those in FIGS. 1A through 2B are denoted with the same reference numerals, and detailed description thereof will be omitted. With the third embodiment, circuit members 9 (flexible print circuits) are used as the intermediate members 7.

The linear expansion coefficient of a common flexible print circuit is $10 \times 10^{-6}$ to $20 \times 10^{-6}$/K. With such a configuration, the number of members with different linear expansion coefficients can be reduced within the imaging apparatus 1, so the number of locations where thermal stress is generated can be reduced. The circuit members 9 are fixed to the peripheral region 221 by the adhesive agent 13, and are fixed to the third region 111 by the adhesive agent 14. The buffer member 11 described in the second embodiment is preferably used instead of the adhesive agent 14.

Fourth Embodiment

Figure 4A:
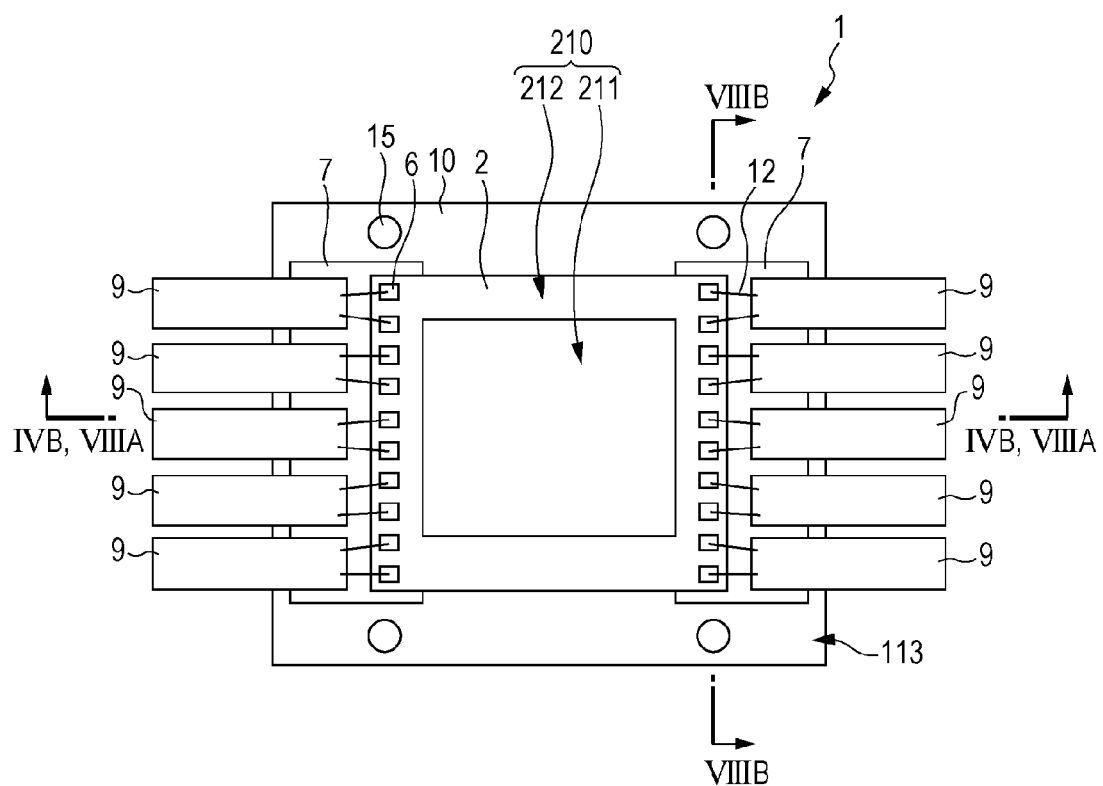
FIGS. 4A and 4B are schematic diagrams for describing a fourth embodiment.
Figure 4B:
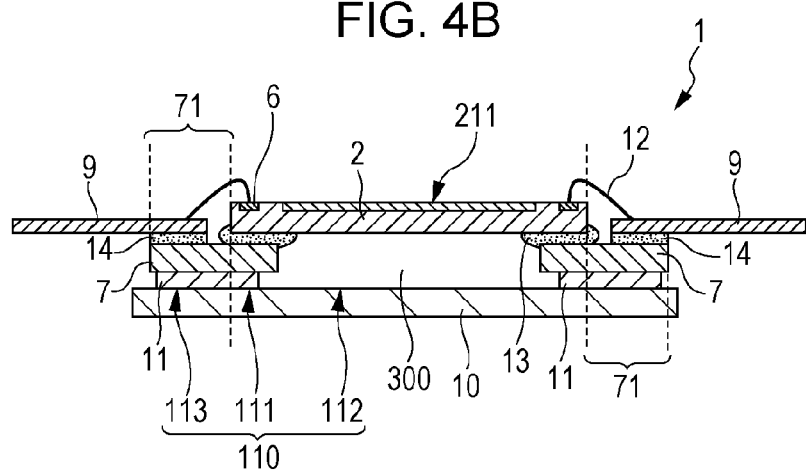

A fourth embodiment will be described with reference to FIGS. 4A and 4B. FIG. 4A is a plan view of the imaging apparatus 1 as viewed from the front face 210 side, and FIG. 4B is a cross-sectional view along IVB-IVB in FIG. 4A. Portions having functions equivalent to those in FIGS. 1A through 3B are denoted with the same reference numerals, and detailed description thereof will be omitted. The present embodiment is the same as with the first through third embodiments in that the intermediate members 7 are situated between the peripheral region 221 and third region 111. With the present embodiment, the intermediate members 7 extend from between the peripheral region 221 and third region 111 onto the fifth region 113 (outside of the peripheral region 221). The portions of the intermediate members 7 which extends onto the fifth region 113 will be called extending portions 71. The circuit members 9 are fixed to the extending portions 71 by the adhesive agent 14. The electrodes 6 and circuit members 9 are electrically connected on the intermediate member 7 by boding wire 12. With this configuration, the increase in distance between the electrodes 6 and circuit members 9 due to rise in temperature of the imaging apparatus 1 can be reduced as compared with the second embodiment, so the rate of line breakage of the bonding wire 12 can be reduced, and the reliability of electrical connection can be improved.

Fifth Embodiment

Figure 5A:
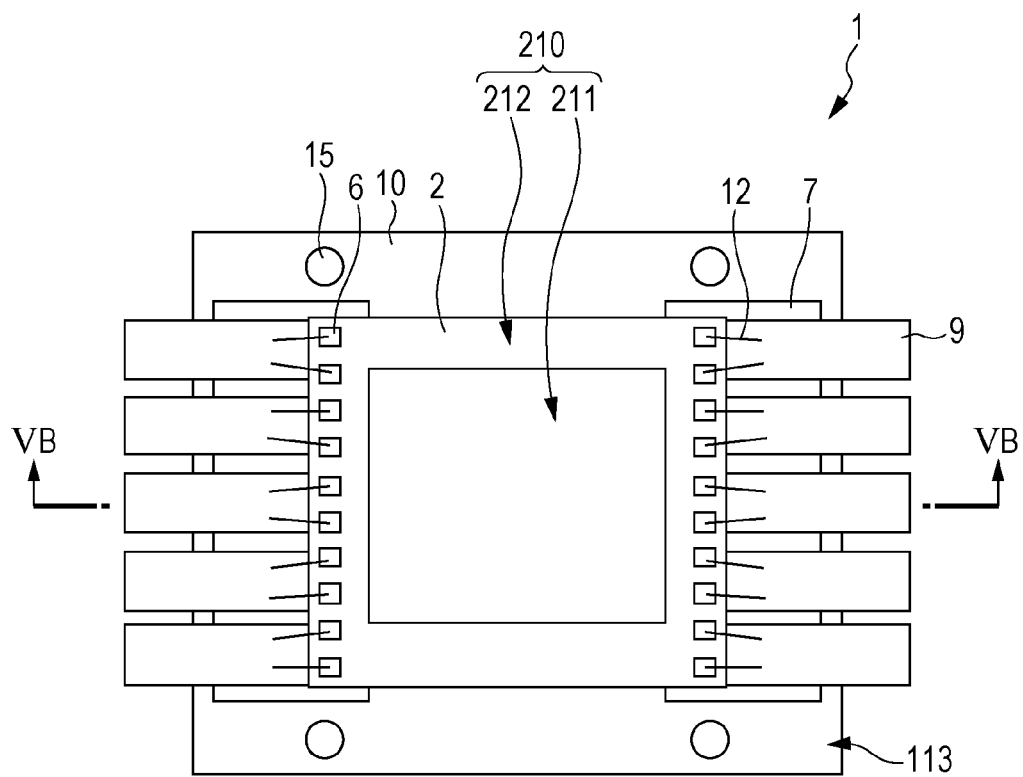
FIGS. 5A and 5B are schematic diagrams for describing a fifth embodiment.
Figure 5B:
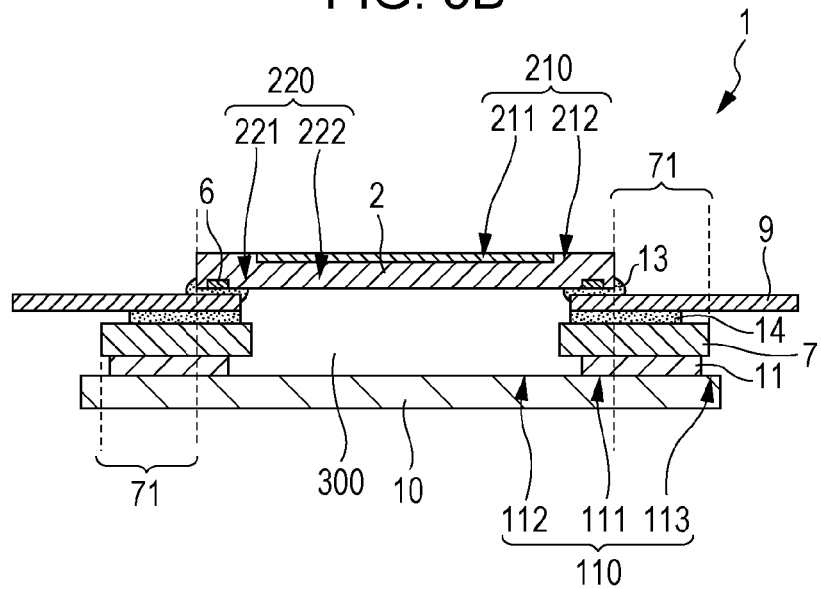

A fifth embodiment will be described with reference to FIGS. 5A and 5B. Portions having functions equivalent to those in FIGS. 1A through 4B are denoted with the same reference numerals, and detailed description thereof will be omitted. The present embodiment differs from the fourth embodiment in that the circuit members 9 extend from upon the extending portions 71 to between the intermediate member 7 and peripheral region 221. According to this configuration, the circuit members 9 are sandwiched between the imaging plate 2 and intermediate members 7, so relative displacement between the imaging plate 2 and circuit members 9 can be reduced, and accordingly and the reliability of electrical connection can be improved. While boding wire can be used with the present embodiment as well, the electrodes 6 and circuit members 9 arrayed on the peripheral region 221 (back face 220) of the imaging plate 2 can be flip chip interconnected as shown in FIG. 5B, without using the bonding wire. Accordingly, a structure can be employed which is free from the problem of line breakage readily occurring with bonding wire, thereby further improving the reliability and durability of the electrical connection.

Sixth Embodiment

Figure 6A:
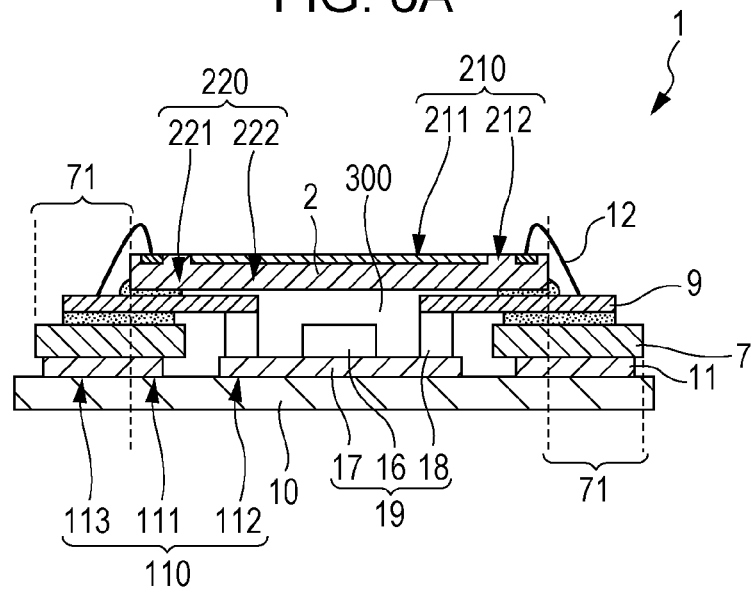
FIGS. 6A and 6B are schematic diagrams for describing a sixth embodiment.
Figure 6B:
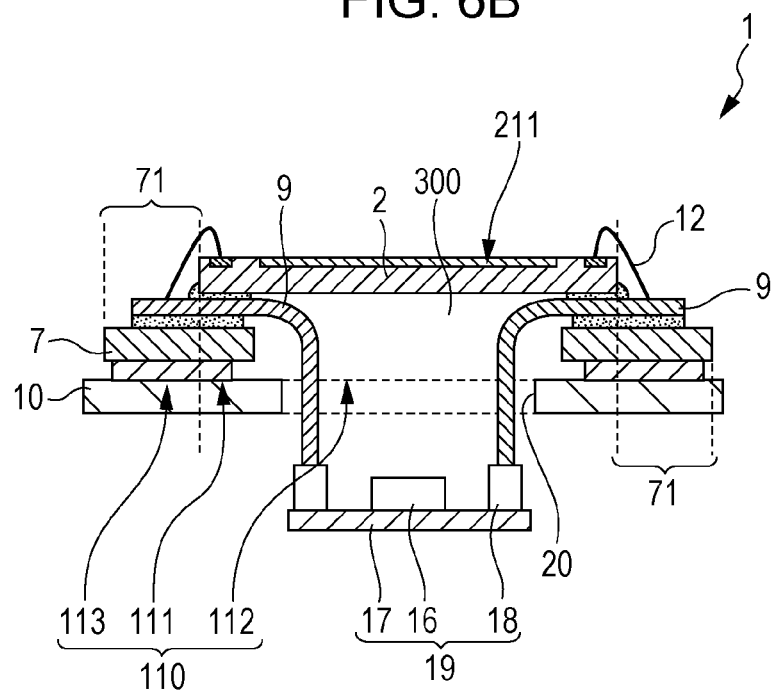

A sixth embodiment will be described with reference to FIGS. 6A and 6B. Portions having functions equivalent to those in FIGS. 1A through 5B are denoted with the same reference numerals, and detailed description thereof will be omitted. The present embodiment differs from the fifth embodiment in that the circuit members 9 extend from between the intermediate members 7 and peripheral region 221 to between the middle region 222 and fourth region 112. Note that while an example is illustrated in FIGS. 6A and 6B where a portion of the circuit members 9 is situated on the extending portion 71, no portion of the circuit members 9 have to be situated on the extending portion 71, and the extending portion 71 itself does not have to be provided. Also, while an example is illustrated in FIGS. 6A and 6B where bonding wire 12 is used for the electrical connection between the electrodes 6 and circuit members 9 on the imaging plate 2, electrodes 6 provided on the back face 220 and the circuit members 9 may be flip chip interconnected such as shown in FIG. 5B.

FIG. 6A is an example of the present embodiment, with an electronic circuit 19 provided between the middle region 222 and fourth region 112. The electronic circuit 19 is electrically connected to the circuit members 9 extending between the middle region 222 and fourth region 112. The electronic circuit 19 may include an IC 16 for signal processing, driving, or the like, unshown passive devices such as resistors, capacitors, inductors, and so forth, a board 17 upon which these can be mounted, a connector 18 for connection to the circuit members 9, and so forth. Thus, disposing the electronic circuit 19 between the retaining plate 10 and the imaging plate 2 allows the overall thickness of the imaging apparatus 1 to be reduced.

FIG. 6B is another example of the present embodiment, with an opening 20 provided in a region of the retaining plate 10 corresponding to the middle region 222. Accordingly, with this example, the fourth region 112 is a region of an imaginary plane including the retaining face 110 (third region 111). The circuit members 9 are led out to the opposite side of the retaining plate 10 from the imaging plate 2 (the back side of the retaining plate 10) via the opening 20. The aforementioned electronic circuit 19 is connected to the circuit members 9 lead out to the back side via the opening 20. With this example, the electronic circuit 19 which can become a heat source can be distanced from the imaging plate 2 as compared with the example in FIG. 6A, and accordingly an imaging apparatus 1 where temperature change of the imaging plate 2 does not readily occur can be obtained, and consequently, thermal expansion generated at the imaging plate 2 can be reduced. Also, random noise due to the temperature change of the imaging plate 2 itself can be reduced, and further, effects of the electromagnetic waves generated by the electronic circuit 19 on the imaging plate 2 can be reduced, thereby obtaining an image with little noise.

Seventh Embodiment

Figure 7A:
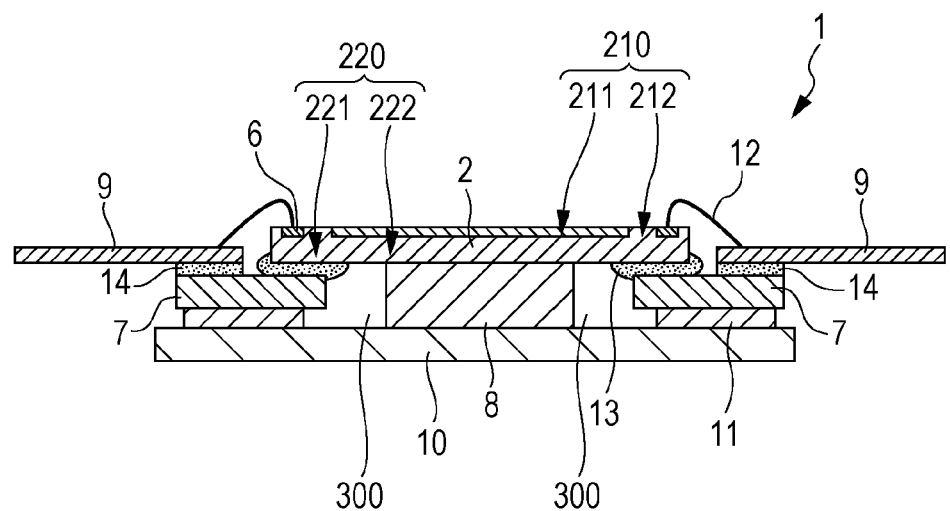
FIGS. 7A and 7B are schematic diagrams for describing a seventh embodiment.

A seventh embodiment will be described with reference to FIGS. 7A and 7B. Portions having functions equivalent to those in FIGS. 1A through 6B are denoted with the same reference numerals, and detailed description thereof will be omitted. As shown in FIG. 7A, with the present embodiment, a spacing stipulating member 8 is placed between the middle region 222 and fourth region 112, fixed to both the imaging plate 2 and retaining plate 10. Accordingly, the void 300 can be provided in a sure manner, and displacement of the imaging plate 2 in a direction perpendicular to the front face 210 due to vibrations or the like can be suppressed.

Figure 7B:
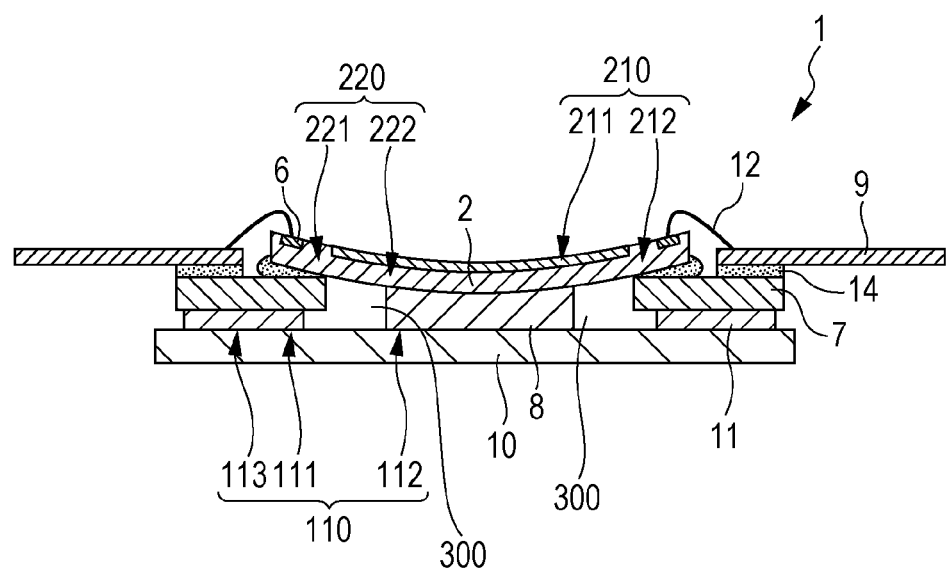

Further, as shown in FIG. 7B, the thickness of the spacing stipulating member 8 may be made to be thinner than the distance between the peripheral region 221 and the third region 111, and fixed to both the imaging plate 2 and retaining plate 10. Thus, the first region 211 of the imaging plate 2 can be pulled toward the retaining plate 10 side such that the front face 210 curves in a concave shape. Alternatively, the front face 210 may be made to curve in a concave shape under the weight of the imaging plate 2 itself without using the spacing stipulating member 8, by having the area of the imaging plate 2 and the void 300 to be sufficiently great. By forming a concave face of the front face 210, field curvature aberration due to object lenses and the like can be reduced. Such a configuration is suitable for cases where the area of the first region 211 (pixel region) is great, since aberration tends to occur at the edges of the first region 211.

Eighth Embodiment

Figure 8A:
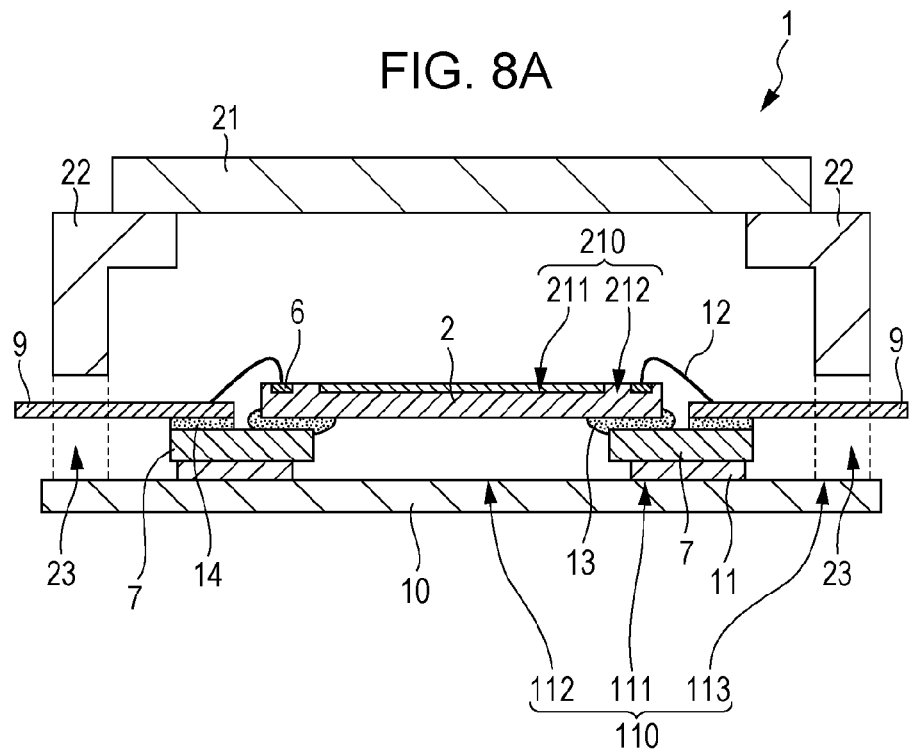
FIGS. 8A and 8B are schematic diagrams for describing an eighth embodiment.
Figure 8B:
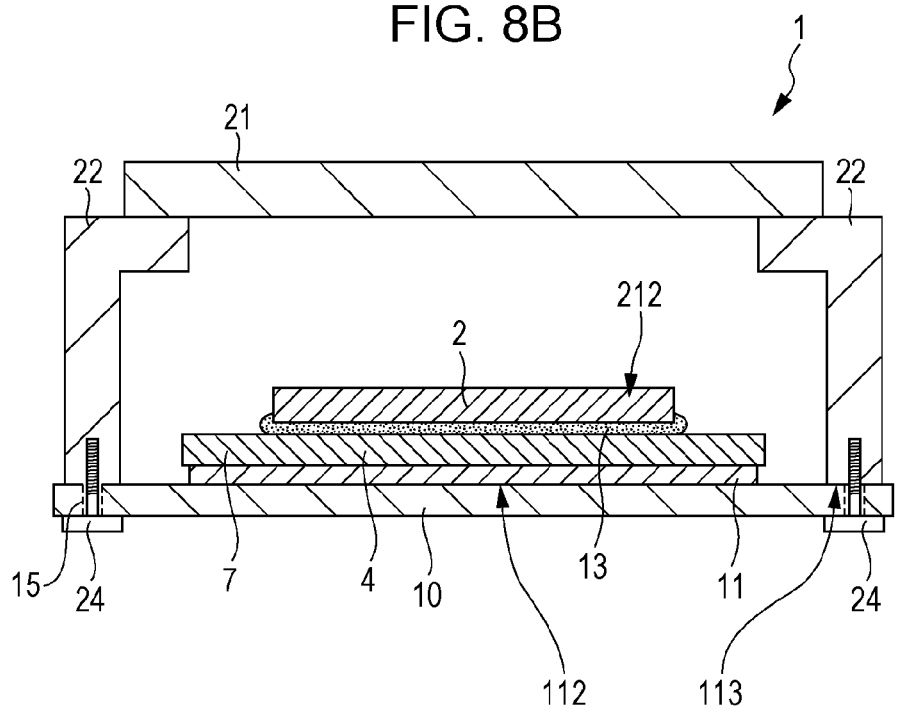

An eighth embodiment will be described with reference to FIGS. 8A and 8B. Portions having functions equivalent to those in FIGS. 1A through 7B are denoted with the same reference numerals, and detailed description thereof will be omitted. FIG. 8A is a cross-sectional view of the imaging apparatus 1, partly including a cross-section along VIIIA-VIIIA shown in FIG. 4A, and FIG. 8B is a cross-sectional view of the imaging apparatus 1, partly including a cross-section along VIIIB-VIIIB shown in FIG. 4A. Note that in FIG. 4A, the cross-section along VIIIA-VIIIA and the cross-section along VIIIB-VIIIB are mutually orthogonal cross-sections.

As illustrated in FIGS. 8A and 8B, the imaging apparatus 1 has a protective plate 21 disposed above the front face 210 side of the imaging plate 2. The protective plate 21 is supported by supporting members 22 disposed above the fifth region 113 of the retaining plate 10. The protective plate 21 is preferably distanced from the imaging plate 2, and the height of the protective plate 21 from the imaging plate 2 can be set by suitably setting the height of the supporting members 22. In the example shown in FIG. 8B, the supporting members 22 are fixed to the retaining plate 10 with screws 24 by way of screw holes 15 provided to the fifth region 113, as illustrated in FIG. 4A. The supporting members 22 may be fixed to the retaining plate 10 using adhesive agent or welding or the like, rather than using the screws 24. Also, the retaining plate 10 and the supporting members may be integrally molded, such that the retaining plate 10 itself supports the protective plate 21. Here, an example where the supporting members 22 and screws 24 have been added to the fourth embodiment illustrated in FIGS. 4A and 4B to yield the present embodiment will be described. However, it should be noted that the present embodiment is applicable to any of the first through seventh embodiments, and that the screw holes 15 are also illustrated in FIGS. 1A, 2A, 3A, and 5A as well.

The supporting members 22 may be disposed above the second region 212 of the imaging plate 2, but from the perspective of reducing shock when attaching to the imaging plate 2 and when using, disposing above the fifth region 113 is better. The supporting members 22 are preferably formed of a metal so as to have rigidity, and may use the same material as the retaining plate 10. Forming the supporting members 22 in a frame shape allows a sealing package (envelope) to be formed which encompasses the imaging plate 2 along with the retaining plate 10 and the protective plate 21. This sealing package can suppress mechanical damage to the front face 210 as well as adhesion of foreign matter such as dust and the like. Note that in the case of forming the supporting members 22 in a frame shape, providing gaps 23 between the supporting members 22 and the retaining plate 10, or providing openings in the supporting members 22, enables the circuit members 9 to be externally led out from the gaps 23 or openings.

The protective plate 21 has transparency whereby at least light to be input to the imaging plate 2 can be transmitted. The protective plate 21 may be one or more filter functions. Filter functions can be realized altering the surface of the protective plate 21 or by film applied to a substrate for the protective plate 21. The filter may be a low-pass or high-pass filter for cutting out a particular spatial frequency band, or may be a wavelength selective filter which does not allow light of a particular wavelength to enter the imaging plate 2. Examples of wavelength selective filters which can be used include infrared filters and color filters. Typically, glass is used for the protective plate 21 or the substrate for the protective plate 21.

Ninth Embodiment

Figure 9:
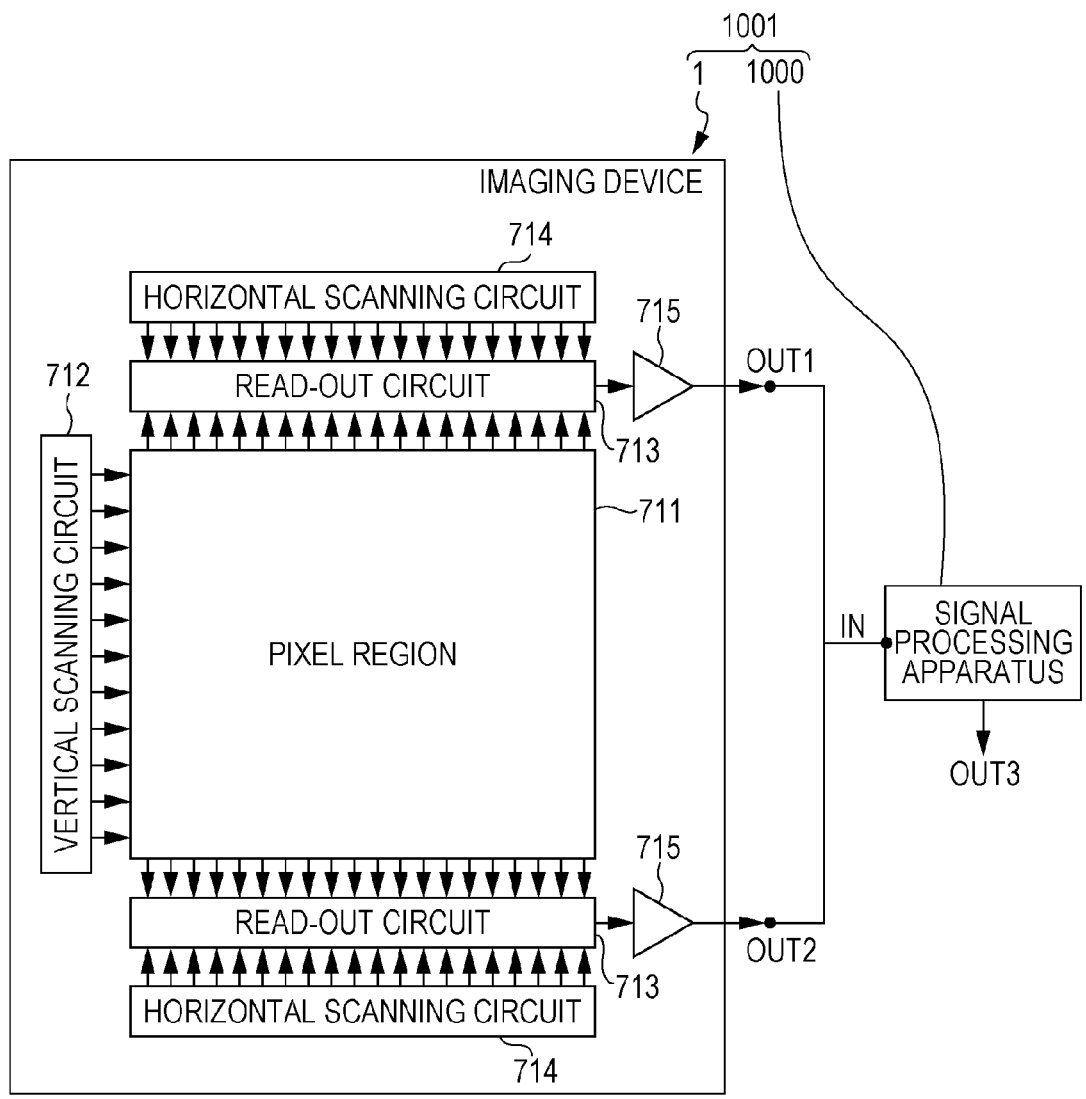
FIG. 9 is a schematic diagram for describing a ninth embodiment.

An example of the imaging apparatus 1 and an imaging system 1001 using the same will be described as a ninth embodiment with reference to FIG. 9. The present embodiment can be applied to any of the first through eighth embodiments. The imaging system 1001 includes the imaging apparatus 1 and a signal processing apparatus 1000 into which output signals from the imaging apparatus 1 are input and which processes these output signals. FIG. 9 is a diagram illustrating an example of the imaging system 1001. Signals are output from OUT1 and OUT2 of the imaging apparatus 1. Here, two output paths of OUT1 and OUT2 are illustrated, but the number of output paths may be one, or may be three or more. OUT1 and OUT2 are equivalent to the above-described electrodes 6 or circuit members 9. The output signals are input to the IN of the signal processing apparatus 1000. The output signals may be electric signals such as current signals or voltage signals, or may be radio signals or light signals. Also, the output signals may be analog signals or digital signals.

The signal processing apparatus 1000 is configured such that inputting a signal to IN outputs an image signal from OUT3. An arrangement may be made such that the electronic circuit 19 described with the sixth embodiment makes up the signal processing apparatus 1000.

An example of the imaging apparatus 1 shown in FIG. 9 will be described. According to the present example, a pixel-amplifying imaging plate is used for the imaging apparatus 1. In FIG. 9, the imaging plate of the imaging apparatus 1 has a pixel region 711, vertical scanning circuit 712, two read-out circuits 713, two horizontal scanning circuits 714, and two output amplifiers 715. The region other than the pixel region 711 is also called a peripheral circuit region.

A great number of photo detectors 213 are arrayed in a two-dimensional form in the pixel region 711. Each photo detector 1 is equivalent to one pixel. A readout circuit 713, e.g. a row amplifier, CDS circuit, adding circuit, or the like, configured of transistors 231 described with reference to FIG. 11B, are provided in the peripheral circuit region, and perform amplification, addition, and so forth as to the signals read out via the vertical signal line from pixels in the row selected by the vertical scanning circuit 712. The row amplifier, CDS circuit, adding circuit, or the like are disposed in each pixel row or in every multiple pixel rows, for example. The horizontal scanning circuit 714 generates a signal for reading out the signals from the read-out circuit 713 in order. The output amplifier 715 amplifies and outputs signals from the row selected by the horizontal scanning circuit 714.

The above-described configuration is only one configuration example of the imaging apparatus 1, and should not be restricted to this example. The readout circuits 713 and horizontal scanning circuits 714 and output amplifiers 715 configure output paths (OUT1, OUT2) for two systems, and are on both sides of the pixel region 711.

A representative example of the imaging system 1001 is a camera such as a still camera or video camera or the like. The imaging system 1001 may have an image formation configuration made up of optical members such as a lens or mirror or the like, in order to form an image on the imaging plate 2. The imaging system 1001 may also have a storage configuration to store the obtained image. The imaging system 1001 can also have a transportation configuration (unshown) that can transport the imaging apparatus 1. An example of a transportation configuration is wheels whereby an electric motor, reciprocating engine, rotary engine, or the like serves as a motion source. Also, an example of a transportation configuration is a propulsion apparatus such as a propeller, turbine engine, rocket engine, or the like. Such an imaging system having a transportation configuration can be realized by mounting the imaging apparatus 1 and signal processing apparatus 1000 on an automobile, rail car, ship, airplane, satellite, or the like.

Other Embodiment

With the present embodiment, description will be made regarding an example of fabricating an imaging apparatus 1 of the form illustrated in FIGS. 4A, 4B, 8A, and 8B, but it should be noted that the present invention is not restricted to this embodiment and that design can be modified.

Figure 10A:
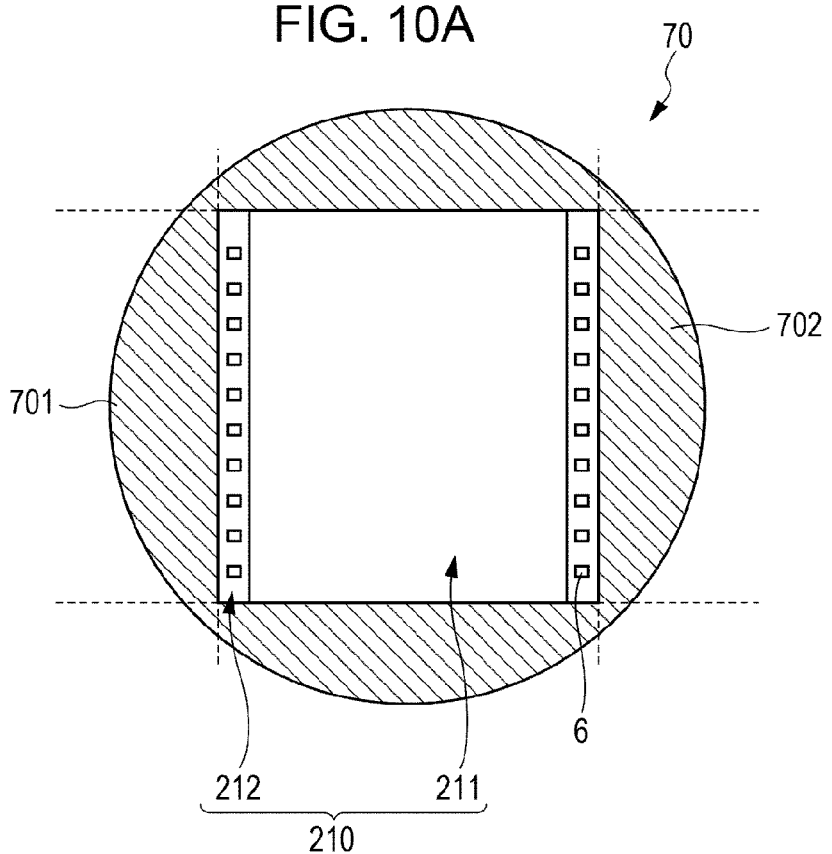
FIGS. 10A and 10B are schematic diagrams for describing an embodiment.
Figure 10B:
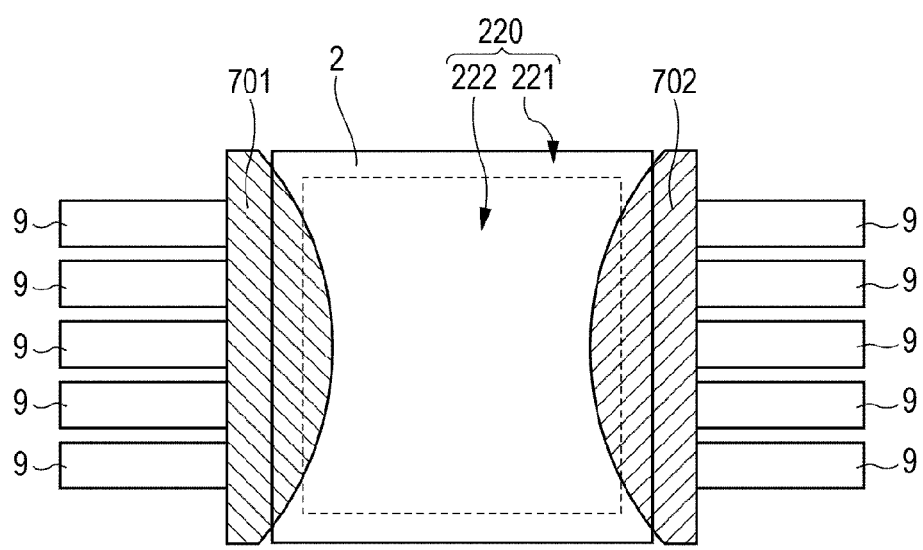

A pixel region was formed by 0.35 μm CMOS process on a disc-shaped silicon wafer 70 0.775 mm thick and 300 mm in diameter. The linear expansion coefficient of the silicon wafer 70 was $2.6 \times 10^{-6}$/K. The pixel region was formed with 1,280 pixels vertically and 1,248 pixel horizontally (of these effective pixels were 1,280 pixels vertically and 1,128 pixel horizontally) were arrayed two-dimensionally at a pixel pitch of 160 μm vertically and 160 μm horizontally. A three-layer aluminum layer was used for the metal layer for wiring. The size of the pixel region was 205 mm vertically and 200 mm horizontally. Electrodes 6 were arrayed one-dimensionally in the vertical direction in regions outside of the pixel region (two such regions, each 205 mm vertically and 1 mm horizontally). Thereafter, the silicon wafer 70 was diced into a generally square shape as illustrated in FIG. 10A, thereby fabricating an imaging plate 2 (CMOS image sensor) 205 mm vertically and 202 mm horizontally, with a diagonal dimension of 287 mm. The area of the imaging plate 2 was 41,410 $mm^2$ for both the front face 210 and the back face 220.

An aluminum plate of a square shape 340 mm vertically and 340 mm horizontally, and 3 mm thick, was prepared as the retaining plate 10. The linear expansion coefficient of the aluminum plate was $24 \times 10^{-6}$/K. The surface of the retaining plate 10 was blackened by black alumite to prevent reflection.

First, two snips 701 and 702 of the silicon wafer 70 which were produced at the time of dicing were prepared as intermediate members 7. Of course, other silicone plates besides the two snips 701 and 702 of the silicon wafer 70 used for fabricating the imaging plate 2 may be used as intermediate members 7 as well. However, using the snips 701 and 702 of the silicon wafer 70 which have passed through the same processes (thermal processing process and so forth) as the imaging plate 2 is preferable since the difference in thermal properties between the imaging plate 2 and the intermediate members 7 can be minimized. The maximum width of the snips 701 and 702 is 49 mm each. While arc-shaped sides were left for the snips 701 and 702 here, around the edges of the arc-shaped snips 701 and 702 may be cut off so that the snips 701 and 702 are worked into strips, with strip-shaped snips being used as the intermediate members 7. Also, polyimide flexible printed circuits with copper lines patterned were prepared, five on each side for a total of ten, for the circuit members 9.

At portions equivalent to the extending portions 71 of the intermediate members 7, thermal hardening silver paste (manufactured by Hitachi Chemical Co., Ltd.) was applied as the adhesive agent 14. The ten flexible printed circuits were fixed five each to the snips 701 and 702 by way of the adhesive agent 14. The reason that multiple circuit members 9 were prepared is to suppress the flexible printed circuits from peeling loose from the snips 701 and 702. The hardening conditions for the adhesive agent 14 were 1 hour in a 150° C. oven.

After the adhesive agent 14 has hardened, the flexible printed circuits were tested for quality, and then a thermal hardening liquid epoxy adhesive agent (manufactured by Panasonic Corporation) was applied to the snips 701 and 702 as the adhesive agent 13. The imaging plate 2 was placed upon the two snips 701 and 702 with the flexible printed circuits attached thereto, and the snips 701 and 702 were fixed to the imaging plate 2 with the adhesive agent 13, such that the electrodes 6 were situated above the adhesive agent 13. Here, a region up to 1 mm from the perimeter of the back face 220, including a portion of the pixel region and the region outside the pixel region, was taken as the peripheral region 221. Also, the snips 701 and 702 were adhered to a portion of the middle region 222 corresponding to a portion of the pixel region, to obtain sufficient adhesion area. The hardening conditions for the adhesive agent 13 were 1 hour in a 150° C. oven. Note that the Young's modulus of the adhesive agent 13 after hardening was 1 GPa or higher. Thus, a member with the imaging plate 2, snips 701 and 702, and circuit member 9 fixed to each other was fabricated.

Next, the integrated imaging plate 2 and snips 701 and 702 were placed on a bonding stage heated to 150° C., and the terminals of the flexible printed circuits and the electrodes 6 were connected by wire bonding. At this time, there was no warping of the imaging plate 2 on which the snips 701 and 702 were adhered due to the bonding stage heat. Also, from the perspective of reliability of connection of the wire bonding, the base material of the imaging plate 2 is preferably sufficiently hard. The adhesive agent 13 used for fixing the imaging plate 2 and the snips 701 and 702 was a hard adhesive agent having a Young's modulus of 1 GPa or higher, so the wire bonding was carried out with no problem.

Next, double-faced tape 5011N (manufactured by Nitto Denko Corporation) 0.15 mm thick and having a substrate of unwoven cloth was applied to the region of the retaining plate 10 corresponding to the third region 111 as the buffer member 11. Note that confirmation was made beforehand that the Young's modulus of the double-faced tape 5011N was 100 MPa or lower. The snips 701 and 702 fixed to the imaging plate 2 were placed on the buffer member 11, and the snips 701 and 702 and the imaging plate 2 were fixed to the retaining plate 10 by way of the buffer member 11. The distance between the peripheral region 221 of the imaging plate 2 and the third region 111 of the retaining plate 10 was 1.0 mm. Thus, the snips 701 and 702 serve as the intermediate members 7.

For the supporting members 22, an aluminum frame 10 mm wide and 10 mm high that had been treated by black alumite processing was screwed to the retaining plate 10. An acrylic plate (23 mm vertically, 32 mm horizontally, and 5 mm thick) adapted to serve as the protective plate 21 was mounted to the supporting members 22. Thus, the imaging apparatus 1 shown in FIGS. 8A and 8B was fabricated.

The environment temperature was changed from -20° C. to 60° C. in an environmental experiment chamber, but no change in warpage of the imaging plate 2 or peeling loose, nor line breakage of the bonding wire 12 was observed. Subsequently, images were shot in a low-illuminance environment of 0.3 lx, and clear images were obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-033693 filed Feb. 18, 2011, which is hereby incorporated by reference herein in its entirety.

What is claimed is:

1. An imaging apparatus comprising:
    an imaging plate having a front face into which light enters and a back face having a middle region including a center and a peripheral region surrounding the middle region;
    a retaining plate having a retaining face configured to retain said imaging plate from said back face side; and
    an intermediate member disposed between said peripheral region and said retaining face by being fixed to said imaging plate and said retaining plate;
    wherein said intermediate member does not extend between
        at least a part of said middle region, and
        at least a part of a facing region on a plane extended from said retaining face, the facing region facing said middle region, and a void is formed therebetween;
    and wherein an arithmetic difference between a linear expansion coefficient of said imaging plate and a linear expansion coefficient of said intermediate member is less than an arithmetic difference between a linear expansion coefficient of said retaining plate and the linear expansion coefficient of said intermediate member.

2. The imaging apparatus according to claim 1, wherein the arithmetic difference between the linear expansion coefficient of said imaging plate and the linear expansion coefficient of said intermediate member is less than the arithmetic difference between the linear expansion coefficient of said imaging plate and the linear expansion coefficient of said retaining plate.

3. The imaging apparatus according to claim 1, wherein the thickness of said intermediate member is half or greater of the distance between said retaining face and said peripheral region.

4. The imaging apparatus according to claim 1, wherein said intermediate member is provided between said peripheral region and said retaining face in a state of having been separated into a plurality.

5. The imaging apparatus according to claim 1, further comprising:
    a buffer member provided between said intermediate member and said retaining face;
    wherein a Young's modulus of said buffer member is 100 MPa or less and the thickness of said buffer member being 0.1 mm or greater.

6. The imaging apparatus according to claim 1, further comprising:
    a circuit member electrically connected to said imaging plate;
    wherein said circuit member is fixed to said intermediate member.

7. The imaging apparatus according to claim 6, said intermediate member having an extending portion extending to the outer side of said peripheral region, wherein said circuit member is fixed to said extending portion.

8. The imaging apparatus according to claim 6, wherein said circuit member is disposed between said intermediate member and said peripheral region.

9. The imaging apparatus according to claim 6, wherein said imaging plate and said circuit member are electrically connected by bonding wire.

10. The imaging apparatus according to claim 1, wherein the primary material of said imaging plate and said intermediate member is silicon.

11. The imaging apparatus according to claim 10, wherein the thickness of said intermediate member is 0.5 mm or greater and 2.0 mm or smaller.

12. The imaging apparatus according to claim 1, wherein the primary material of said retaining plate is a nonmagnetic metal.

13. The imaging apparatus according to claim 1, wherein said front face forms a concave face.

14. The imaging apparatus according to claim 1, wherein the area of said front face is 300 $mm^2$ or greater.

15. The imaging apparatus according to claim 1, wherein the area of said front face is 10,000 $mm^2$ or greater.

16. An imaging system comprising:
    an imaging apparatus according to claim 1; and
    a signal processing apparatus to which output signals from said imaging apparatus are input, and which processes said output signals and outputs image signals.

17. An imaging apparatus comprising:
    an imaging plate, having a front face into which light enters, and a back face having a middle region including a center and a peripheral region surrounding the middle region;
    a retaining plate having a retaining face configured to retain said imaging plate from said back face side; and
    an intermediate member disposed between said peripheral region and said retaining face by being fixed to said imaging plate and said retaining plate;
    wherein the area of said front face is 300 $mm^2$ or greater;
    and wherein said intermediate member does not extend to between
        at least a part of said middle region, and
        at least a part of a facing region on a plane extended from said retaining face, said middle region, and a void is formed therebetween;
    and wherein the primary material of said imaging plate and said intermediate member is silicon, and the primary material of said retaining plate is a nonmagnetic metal.

18. The imaging apparatus according to claim 17, wherein the thickness of said intermediate member is 0.5 mm or greater and 2.0 mm or less, and the area of said front face is 10,000 $mm^2$ or greater.

19. The imaging apparatus according to claim 17, further comprising:
    a buffer member provided between said intermediate member and said retaining face;
    wherein a Young's modulus of said buffer member is 100 MPa or smaller and the thickness of said buffer member being 0.1 mm or greater.

20. An imaging system comprising:
    an imaging apparatus according to claim 17; and
    a signal processing apparatus to which output signals form said imaging apparatus are input, and which processes said output signals and outputs image signals.

* * * * *